United States Patent [19]
Sharrit

[11] 3,968,427
[45] July 6, 1976

[54] GROUP DELAY MEASUREMENT APPARATUS AND METHOD

[75] Inventor: David D. Sharrit, Santa Rosa, Calif.

[73] Assignee: Hewlett-Packard Company, Palo Alto, Calif.

[22] Filed: Aug. 11, 1975

[21] Appl. No.: 603,821

[52] U.S. Cl............................. 324/57 SS; 324/83 R
[51] Int. Cl.² ........................................ G01R 27/00
[58] Field of Search.............. 324/57 SS, 57 R, 83 R

[56] References Cited
UNITED STATES PATENTS

| | | | |
|---|---|---|---|
| 3,384,818 | 5/1968 | Longerich et al............. | 324/57 R X |
| 3,445,762 | 5/1969 | Wu................................. | 324/57 SS |

Primary Examiner—Stanley T. Krawczewicz
Attorney, Agent, or Firm—Patrick J. Barrett

[57] ABSTRACT

A network analyzer which compares a reference signal supplied to a device under test with an output signal from the device under test is used to measure the group delay caused by the device under test. The reference signal is produced by a swept frequency signal generator. During the sweep of the signal generator the difference between the instantaneous frequencies of the reference signal and the output signal from the device under test is determined as is the rate of change of the frequency of the reference signal. The instantaneous frequency difference is divided by the rate of change of the reference frequency to produce an instantaneous indication of the group delay produced by the device under test.

11 Claims, 13 Drawing Figures

GROUP DELAY MEASUREMENT APPARATUS AND METHOD

BACKGROUND OF THE INVENTION

Group delay is a measure of the rate of change of phase shift through a device as a function of frequency and is therefore a very useful measurement for characterizing the performance of RF and microwave devices. Since a nonlinear change in phase shift with frequency can produce distortion in a signal, group delay provides a good measure of the distortion produced by a device. Thus it is common to measure and specify the group delay of filters, amplifiers, mixers, cables and other transmission devices.

In the past, group delay has been measured at a single frequency by changing slightly the frequency of the signal passing through the test device and noting the change in phase. One can then make a calculation of the change in phase over the change in frequency which gives the average group delay of the range over which the frequency was changed. Single frequency measurements, however, are inconvenient when a broad band device is being tested since much time and effort is required to make measurements over any appreciable band of frequencies.

Prior art methods are also available for measuring group delay on a swept frequency basis. Such a method is described, for example, in Hewlett-Packard Application Note 77-4 entitled "Swept Frequency Group Delay Measurements," 1968. In the method described in the Application Note, a swept frequency signal generator, or sweeper, supplies the device under test with a signal whose frequency changes linearly with time. This signal is modulated at some convenient lower frequency so that an amplitude modulated signal passes through the device under test. The output signal from the device under test is passed through a detector to recover the modulation signal; and a ratio voltmeter, such as the Hewlett-Packard Model 8405 Vector Voltmeter, is connected to measure both the original modulation signal and the detected modulation signal. The voltmeter indicates the phase difference between the two signals; and, given the modulation frequency, this phase information can be transferred into group delay.

This method has, however, several inherent disadvantages. The modulation frequency is a measure of the smallest band width within which fluctuations in delay can still be measured, and the period of the modulation frequency is equal to the largest group delay measurable. Thus, ideally, the smaller the modulation frequency the larger and more accurate a measurement can be made. However, with smaller modulation frequencies the resultant phase shift for any given delay will be smaller and harder to measure. Thus the resolution will be decreased as the frequency decreases. On the other hand, increasing the frequency to increase the resolution decreases accuracy and also runs into the problem that the modulation frequency may be greater than the passband of the device under test. Furthermore, this method requires the measurement of the phase between two sinusoidal signals: the modulation signal and the detected modulation signal. Any distortion introduced in the modulation signal by the device under test can lead to errors in the measurement of the phase and thus lead to errors in the measurement of group delay.

SUMMARY OF THE INVENTION

According to the preferred embodiment of the present invention a network analyzer is provided with a test channel and a reference channel. A swept frequency generator is connected directly to the reference channel and also to a device under test. The output of the device under test is connected to the test channel and the signals in both channels are frequency converted to a common intermediate frequency (IF) by a local oscillator that tracks the swept frequency generator. The frequency of each IF signal is measured by a discriminator which produces an output signal proportional to the frequency of the signal at the input of the discriminator. The outputs of the two discriminators are connected to a circuit which produces a signal equal to the difference between the two signals. The swept frequency generator also supplies a d.c. tuning signal which changes value in accordance with the change in the output signal frequency. A differentiator circuit in the network analyzer differentiates the tuning signal to produce a signal which indicates the instantaneous rate of change, or slope, of the frequency from the swept frequency generator. Both the frequency difference signal and the slope signal are supplied to a divider where the frequency difference signal is divided by the slope signal to produce a signal which indicates the group delay caused by the device under test.

The preferred embodiment of the present invention has several advantages over prior art devices for measuring group delay. For example, an external modulator and external modulation source are unnecessary since the inherent frequency modulation of the swept signal is utilized instead. By eliminating the use of a sinusoidal modulation signal problems in measuring the phase relationship of distorted sinusoidal signals are also eliminated. In addition, the rate at which the sweeper output changes frequency determines the resolution and accuracy of the measurement, providing an appropriate trade-off for both broad band and narrow band devices.

DESCRIPTION OF THE PREFERRED EMBODIMENT

Figure 1:
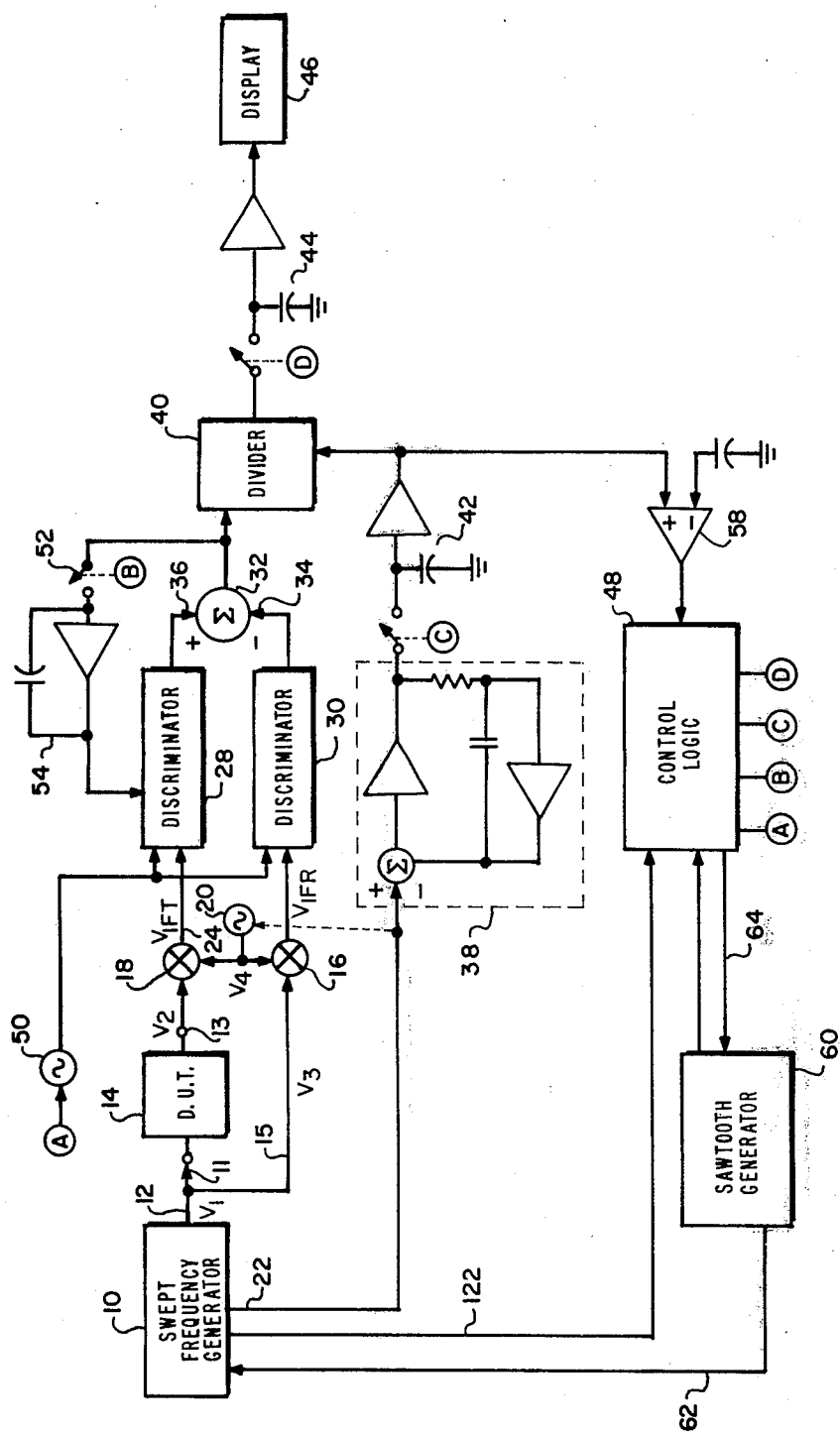
FIG. 1 shows a block diagram of the preferred embodiment of the present invention.

FIG. 1 shows a block diagram of the preferred embodiment of the present invention. A swept frequency generator 10 produces an output signal on line 12 which varies in frequency with time. A portion of the output signal $V_1$ is supplied to a device under test 14 via a connector 11, and another portion of the signal $V_3$ is supplied directly to an input mixer 16 of a network analyzer. The output signal $V_2$ from the device under test is supplied to a mixer 18 via a connector 13. Signals $V_2$ and $V_3$ are down-converted by the same signal $V_4$ supplied by an oscillator 20, which accurately tracks the frequency of the signal from the swept frequency generator, but differs therefrom in frequency by a fixed amount. This fixed frequency difference determines the IF frequency of the network analyzer, and the tracking signal $V_4$ can be generated by any of a number of methods well known in the network analyzer art. Swept frequency generator 10 also has an output line 22 which carries a DC signal that varies in value proportionately to the variations in the frequency of $V_1$. Typically the signal on this line is a buffered tuning signal that is used to tune the variable frequency oscillator in a swept frequency generator.

Figure 2:
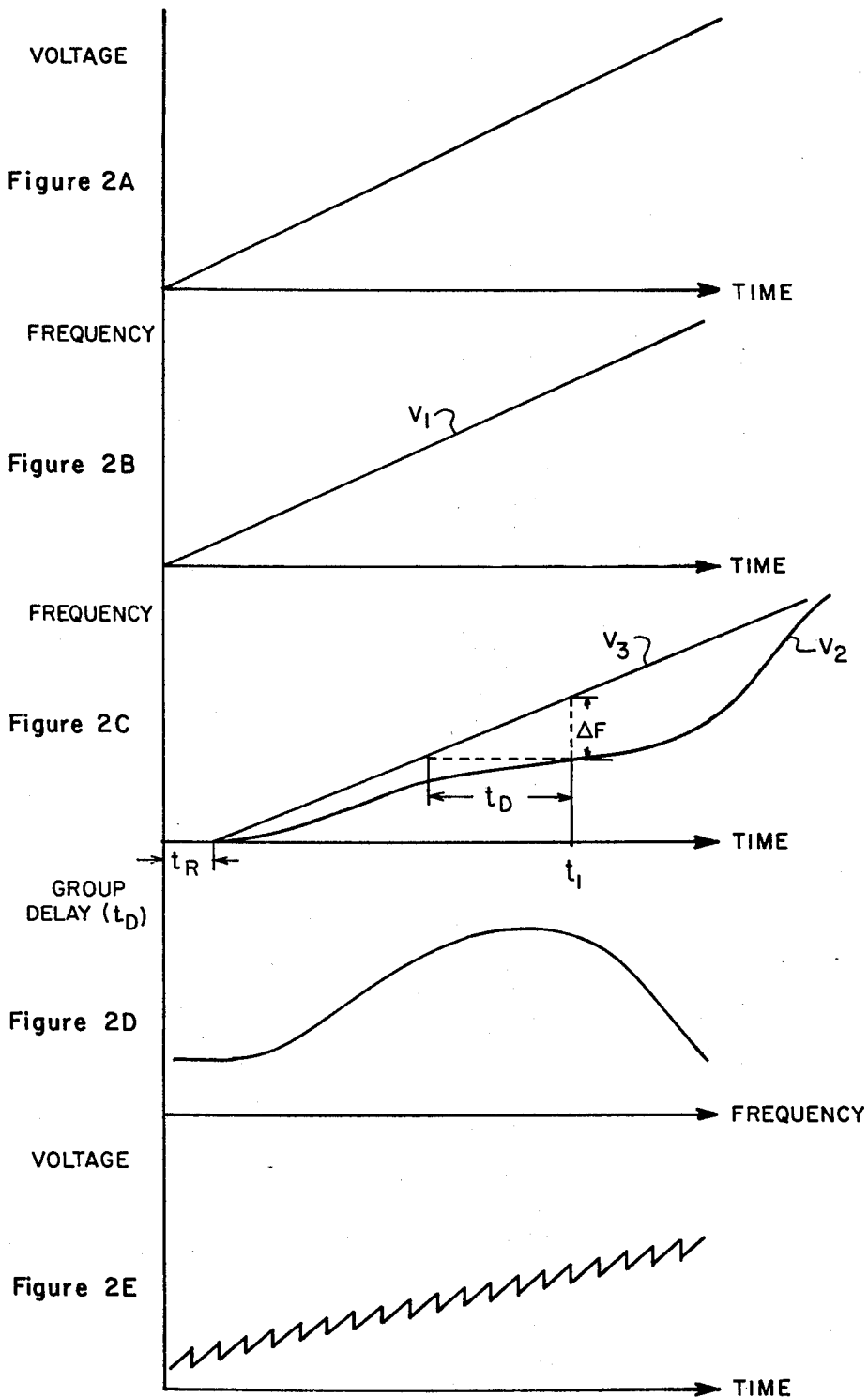
FIGS. 2A through 2E are graphs illustrating the operation of the preferred embodiment.

Group delay is a measure of the time delay introduced in a signal as it passes through a device, and therefore the group delay introduced by device under test 14 can be determined by comparing the time delay of signal $V_2$ as compared with signal $V_3$. The output signal from the swept frequency generator $V_1$ can be expressed as:

$$V_1 = A \sin ((\omega_o + \tfrac{1}{2}\alpha t) t)$$

where $\omega_o$ is the frequency of the output signal at time $t=0$ and $\alpha$ is the frequency sweep rate expressed in radians per second per second. The variation in frequency of $V_1$ with time is shown in FIG. 2B and the corresponding variation of the signal on line 22 with time is shown in FIG. 2A. As the signal passes through device under test 14 it will be delayed by an amount of time $t_T$ at a particular frequency and likewise the signal on line 15 to mixer 16 will be delayed by an amount $t_R$. Thus, signals $V_2$ and $V_3$ can be expressed as:

$$V_2 = A \sin ((\omega_o + \tfrac{1}{2}\alpha(t+t_T))(t+t_T)$$

$$V_3 = A' \sin ((\omega_o + \tfrac{1}{2}\alpha(t+t_R))(t+t_R)).$$

The down-converting signal from oscillator 20 which tracks the frequency of signal $V_1$ with a constant difference $\omega_{IF}$ can be expressed as:

$$V_4 = B \sin ((\omega_o + \omega_{IF} + \tfrac{1}{2}\alpha t) t).$$

The result of the down-conversion process is two IF signals $V_{IF_T}$ from mixer 18 and $V_{IF_R}$ from mixer 16 on lines 24 and 26 respectively and these two signals equal:

$$V_{IF_T} = C \sin (\omega_o t_T + \tfrac{1}{2}\alpha t_T^2 + \omega_{IF} t + \alpha t t_T),$$

$$V_{IF_R} = C' \sin (\omega_o t_R + \tfrac{1}{2}\alpha t_R^2 + \omega_{IF} t + \alpha t t_R).$$

The delay introduced by line 15 in signal $V_3$ will be a constant time delay, $t_R$, at all frequencies if line 15 is a good transmission line. This is shown in FIG. 2C where a curve representing $V_3$ as a function of time is shown shifted with respect to $V_1$ by the amount $t_R$. For most devices other than a simple transmission line, the time delay as a function of frequency will vary as illustrated, for example, by signal $V_2$ in FIG. 2C. As mentioned before, the group delay at a particular frequency is the time delay between $V_2$ and $V_3$ shown by $t_D$ in FIG. 2C. The quantity $t_D$ can be determined by knowing the frequency difference $\Delta F$ and the slope of the frequency curve $V_3$ at some particular time $t_1$. Although frequency curve $V_3$ is shown as having a constant slope, the same relationship holds for a curve with a varying slope. As can be seen from the figure, $\Delta F$ will vary as the group delay varies and this frequency difference will appear in the IF signals after down-conversion.

As shown in FIG. 1, line 24 carrying $V_{IF_T}$ is connected to a discriminator 28 which produces an output current whose DC value is directly proportional to the frequency of $V_{IF_T}$. Likewise, line 26 carrying $V_{IF_R}$ is connected to a discriminator 30 which similarly produces an output current proportional to the frequency of $V_{IF_R}$. The difference between the frequencies of $V_{IF_T}$ and $V_{IF_R}$ can be produced by determining the difference between the output signals from discriminators 28 and 30 in a summing circuit 32 with a negative input 34 and a positive input 36. From the equations for $V_{IF_T}$ and $V_{IF_R}$ it can be seen that:

$$\Delta F = \alpha(t_T - t_R)$$

and from this it follows that:

$$t_D = t_T - t_R = \Delta F/\alpha.$$

The output of summing circuit 32 is a voltage which is proportional to the frequency difference $\Delta F$. In order to determine the group delay $t_D$ it is only necessary therefore to determine the slope of the frequency versus time curve, i.e. the sweep rate $\alpha$. Line 22 carrying tuning signal is connected to a differentiator circuit 38 which differentiates the tuning signal to produce a signal proportional to the rate of change of the tuning signal. Since the tuning signal is changing at the same rate as the frequency of $V_1$ the output of differentiator circuit 38 is proportional to the sweep rate $\alpha$. The output of summer 32 is connected to an analog divider circuit 40. The output of differentiator 38 is also connected to divider 40 via a synchronous low-pass filter (LPF) 42. Divider 40 produces an analog output signal proportional to the ratio of $\Delta F/\alpha$, and this output signal passes through a sample and hold circuit 44 to a display 46. Display 46 may be a meter, a cathode ray tube, a digital readout or other suitable display.

Synchronous LPF 42 and sample and hold circuit 44 are controlled by control logic 48 so that during a sweep of swept frequency generator 10, both circuits remain closed, allowing the signals applied to them to pass directly through. The circuits are both open during retrace of the swept frequency generator to eliminate confusing information on the display.

Since the discriminators operate open loop, a calibrator circuit is provided to periodically calibrate both discriminators. Periodically the control logic switches on an oscillator 50 that produces a signal at the IF frequency, which is nominally 100 KHz in the preferred embodiment. This signal overrides the input signals to discriminators 28 and 30, and sample and hold circuit 44 is opened to prevent erroneous information from appearing on the display. At the same time the signal is supplied by oscillator 50 a switch 52 which is closed to connect the output of summing circuit 32 to an integrator circuit 54. This integrator circuit 54 is connected to a gain control element in discriminator 28 to adjust the gain of that discriminator so that the output of summing circuit 32 is zero, indicating that the frequencies of the input signals to both discriminators are the same. After a few milliseconds, oscillator 50 is turned off and switch 52 is opened again and normal operation is resumed. This calibration procedure is repeated during every retrace, or every second, if the sweep of the swept frequency generator takes longer than a second.

At very low sweep rates $\alpha$ becomes so small that the IF phase noise on the $\Delta F$ signal causes an objectionably noisy group delay signal when the $\Delta F$ signal is amplified in the divider by the inverse of $\alpha$. In order to provide a signal that has a steeper slope, a sawtooth signal generator 60 is provided which supplies a sawtooth signal on a line 62 to the swept frequency generator, upon command from the control logic on a line 64. The threshold level of the slope signal at which the sawtooth generator is triggered is determined by comparator circuit 58. The sawtooth signal is summed into the tuning voltage in swept frequency generator 10 so that the tuning voltage appears as shown in FIG. 2E. As a result of this variation in the tuning voltage the frequency of signal $V_1$ also varies in the same fashion.

Since this tuning voltage with the sawtooth variations is supplied to differentiator circuit 38 the slope signal at the output of the differentiator will reflect the slope of the sawtooth added to the slope of the tuning signal. In order to provide a smooth slope signal, synchronous LPF 42 under the command of control logic 48 samples the output of differentiator circuit 38 at the peak of each sawtooth and holds that value until the end of the next sawtooth. This signal is fed to divider 40 and the output of the divider is likewise sampled by sample and hold circuit 44 to produce a smooth output signal to display 46.

The use of the inherent frequency modulation in the signal $V_1$ from the swept frequency generator has distinct advantages with respect to the tradeoff between accuracy and resolution discussed above in the Background of the Invention. When broad band devices are being tested, the swept frequency generator is usually sweeping fast and the modulation rate is correspondingly high, giving high resolution to allow measurement of the small delay times that are usually characteristic of broad band devices. Similarly, when a narrow band device is being measured the sweep rate is usually much slower, giving a correspondingly lower modulation rate, thus providing more accurate readings.

Figure 3:
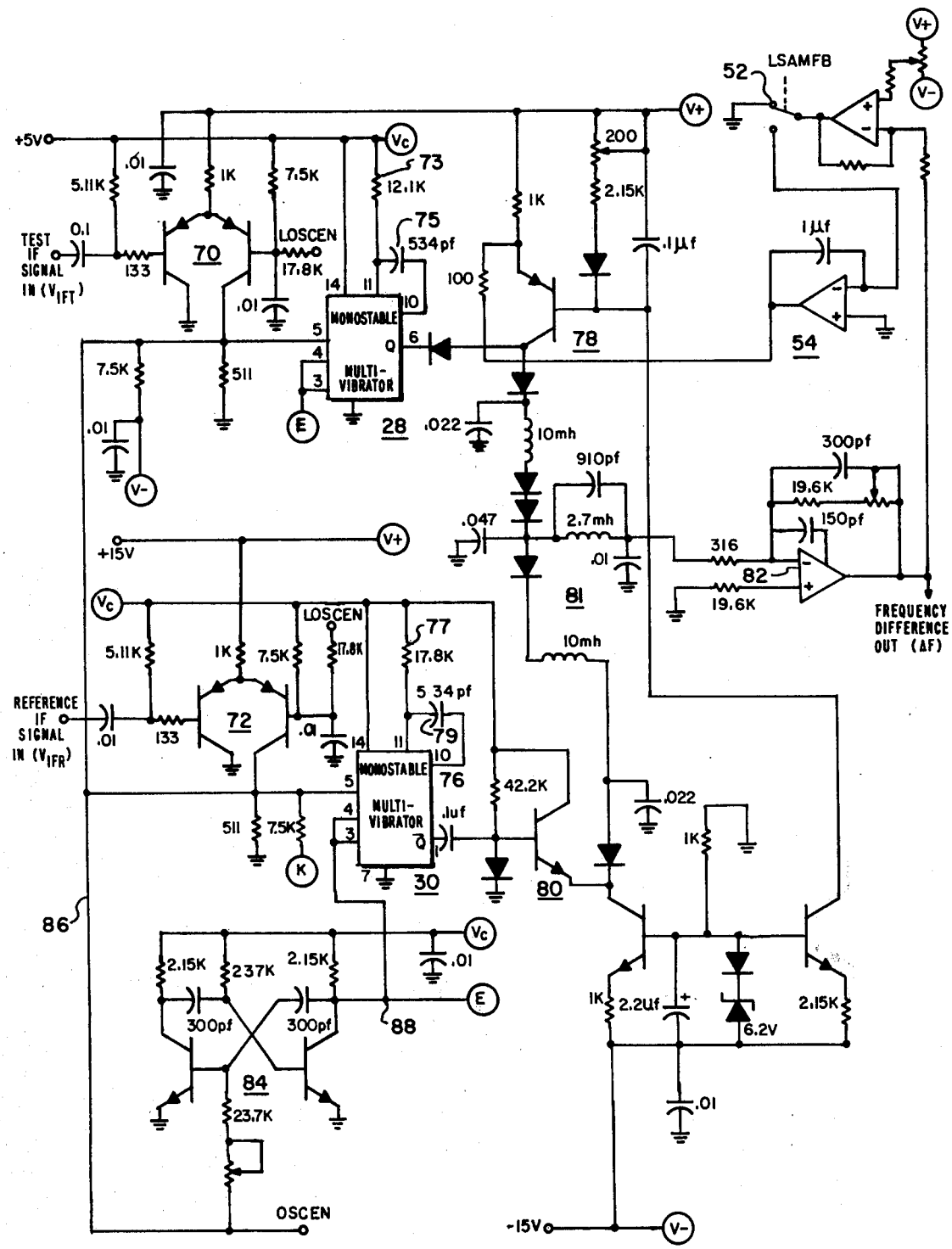
FIG. 3 shows a schematic diagram of frequency discriminators and a summer.

FIG. 3 shows a detailed schematic diagram of the discriminator circuits and summing circuits of the preferred embodiment of the present invention. IF signals, $V_{IF}$ and $V_{IF}$ pass through buffer amplifiers 70 and 72, respectively, to monostable multivibrators 74 and 76, respectively. Each monostable multivibrator may be a model 74-121 produced by a number of manufacturers such as Texas Instruments, Incorporated. Each time a signal at the input pin 5 of the monostable multivibrator varies from a high level to a low level the monostable multivibrator produces an output pulse that is approximately 4 microseconds long. This time is selected by resistor-capacitor networks 73, 75 and 77, 79. The monostable multivibrators are connected to current switches 78 and 80, respectively. When the frequencies of the two signals are the same, the current switches turn on and off for the same amount of time, and they are connected such that current switch 78 adds current and current switch 80 subtracts current. When the frequencies of the two IF signals are different, a signal is developed at the input of a summing amplifier 82 to produce a frequency difference output signal proportional to the difference in the frequencies of the two IF signals. The current signals pass through a lowpass filter 81 connected to the input of the summing amplifier 82 to remove higher frequency components produced by the switching action.

A multivibrator 84 is also shown in FIG. 3 connected to input pins 3 and 4 of each of the monostable multivibrators 74 and 76. When a low signal appears on the LOSCEN inputs of amplifiers 70 and 72, the amplifiers are turned off, blocking the normal inputs on pin 5 to the monostable multivibrators. The oscillator output signal is enabled by a high signal on an OSCEN input, and it appears on a line 88 which is connected to the alternate input on pins 3 and 4 of each of the monostable multivibrators. Thus each discriminator receives the same calibrated signal when multivibrator 84 is energized.

Also shown in FIG. 3 is integrator 54 connected to current switch 78 for adjusting the gain of that current switch and thereby adjusting the gain of discriminator 28. The frequency difference output signal is connected to integrator 54 via switch 52 in response to a signal LSAMFB.

Figure 4:
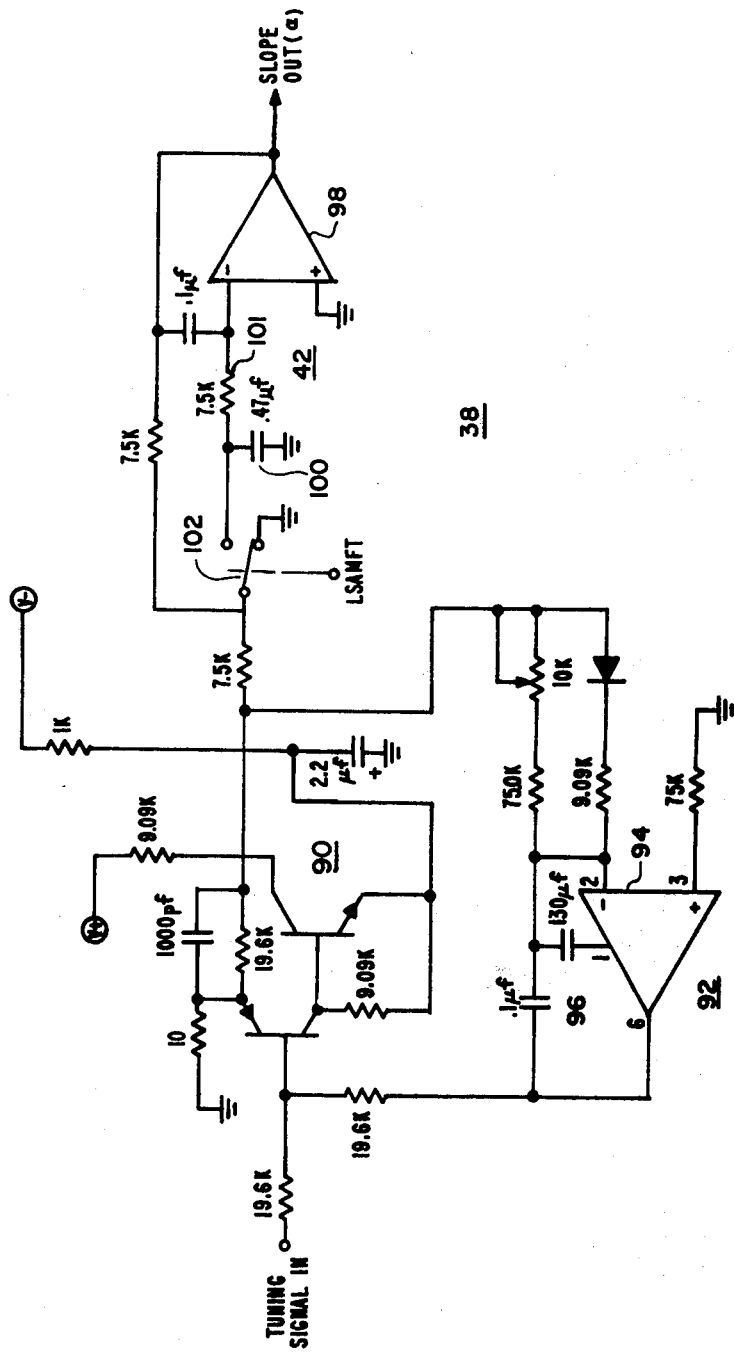
FIG. 4 shows a schematic diagram of a differentiator circuit.

FIG. 4 shows differentiator circuit 38 which comprises an amplifier 90 with an integrator 92 in its feedback loop. By placing an integrator in the feedback loop of the amplifier a differentiator is thus produced. The integrator comprises an amplifier 94 with a Miller feedback capacitor 96. The output of the differentiator passes through synchronous LPF 42 which has a passband of approximately 100 Hz and comprises an amplifier 98, capacitor 100, resistor 101 and switch 102. The switch 102 closes in response to the signal LSAMFT.

Figure 5:
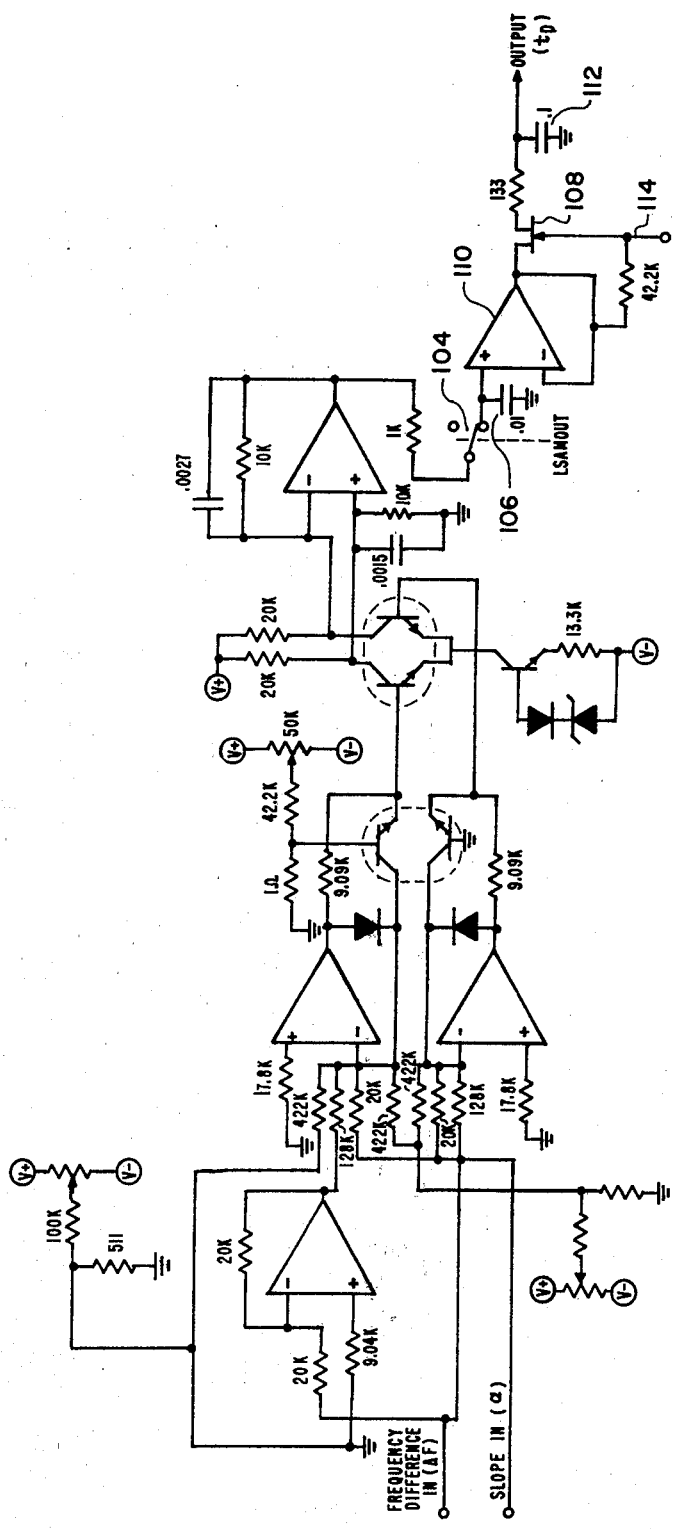
FIG. 5 shows a schematic diagram of a divider circuit.

A schematic diagram of the analog divider is shown in FIG. 5. The analog divider is a standard circuit that may be found in *Nonlinear Circuits Handbook* published by Analog Devices, 1974 (see Basic Circuits chapter, page 290, FIG. 15). The divider circuit provides two quadrant division so that the correct output is produced for either polarity of the $\Delta F$ signal. The sample and hold circuit at the output of the divider actually comprises two switches and associated holding capacitors. The signal first passes through switch 104 and is held on capacitor 106. Capacitor 106 is connected to a FET switch 108 by an amplifier 110. The signal at the output of switch 108 is held on a capacitor 112. Switch 104 closes in response to signal LSAMOUT and switch 108 closes in response to a signal on line 114.

Figure 6:
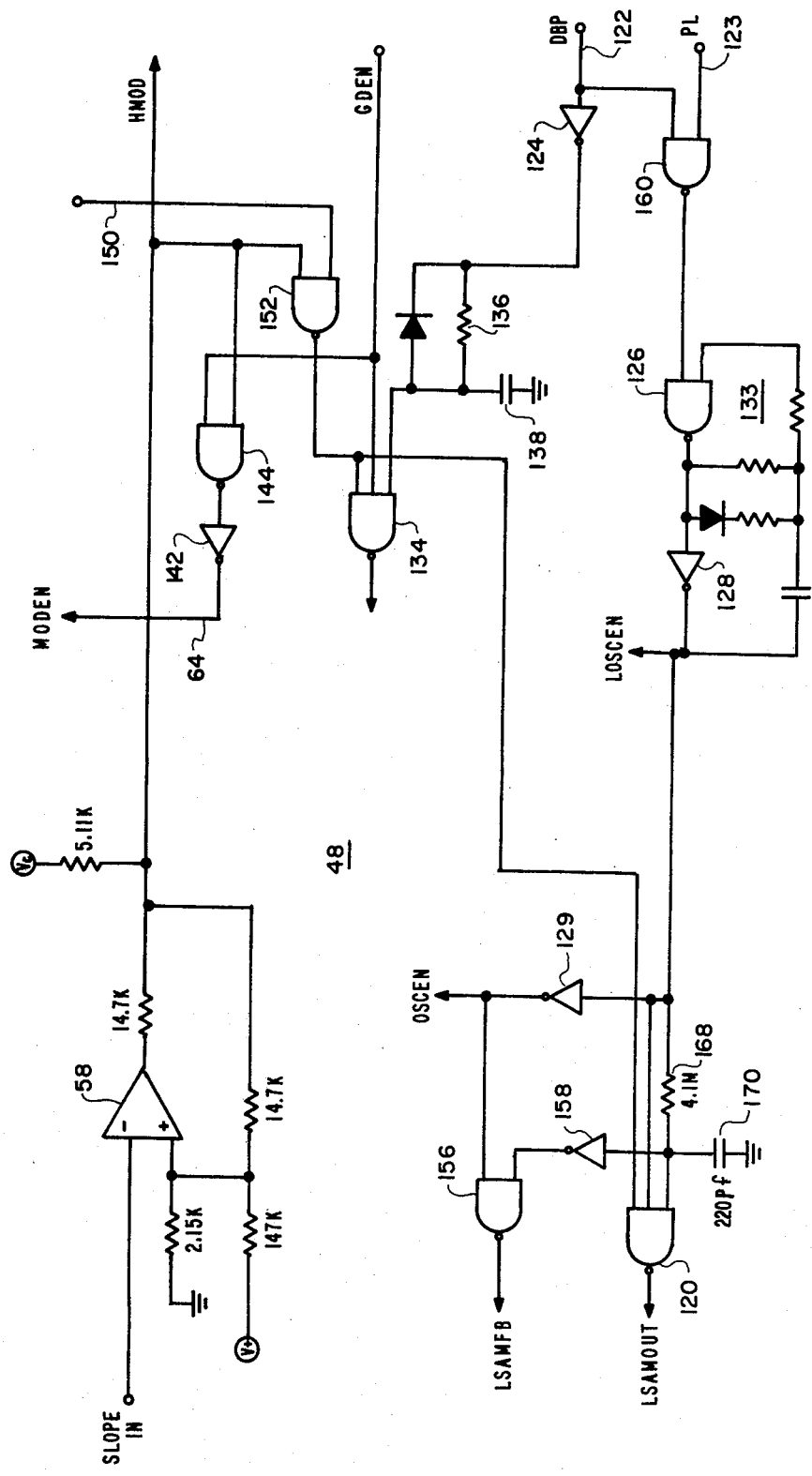
FIG. 6 shows a schematic diagram of the control logic of FIG. 1.
Figure 8:
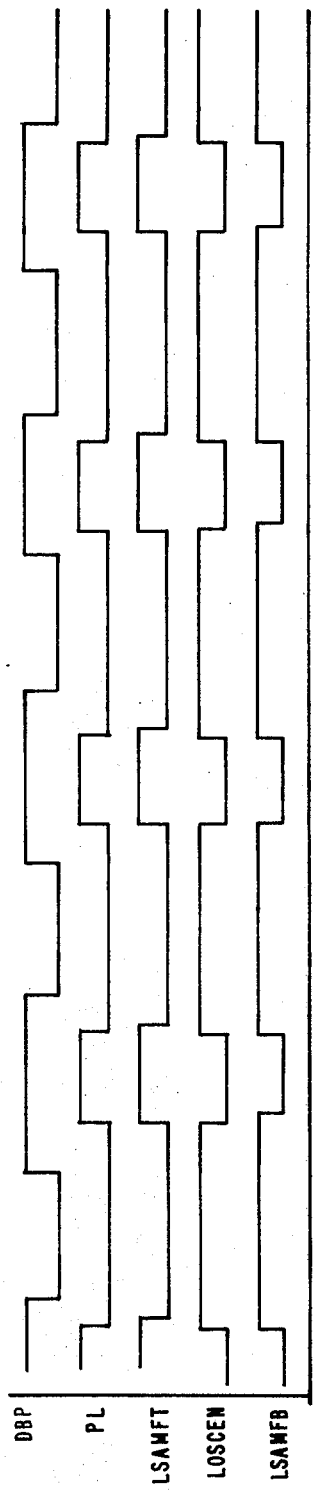
FIGS. 8 and 9 are timing diagrams illustrating the operation of the preferred embodiment.

FIG. 6 shows a schematic diagram of control logic 48 and FIG. 8 shows a timing diagram of the output signals from control logic 48 during normal operation. The value of the slope $\alpha$ is high enough during normal operation that comparator 58 inhibits sawtooth generator 60 by producing a low signal on the HMOD line. The output of comparator 58 is connected to the input of a NAND gate 152 which is in turn connected to a NAND gate 120 whose output supplies signal LSAMOUT that activates switch 104 (see FIG. 5). Gate 120 also receives a signal LOSCEN from a NAND gate 126 via an inverter 128. When HMOD is low and LOSCEN is high, LSAMOUT will be low; and thus, during normal operation and when the swept frequency generator is sweeping, switch 104 is always closed. As will be explained in greater detail below, the signal on line 114 will also cause FET switch 108 to be on while the HMOD signal is low.

After the swept frequency generator has completed a sweep it must retrace to start sweeping again. During the retrace, the swept frequency generator supplies retrace signals which are used in swept frequency instruments such as network analyzers to blank the display or lift a recorder pin and thereby eliminate otherwise confusing or erroneous information. These retrace signals, DBP and PL appear on lines 122 and 123 respectively connected to control logic 48. When PL goes high it generates LOSCEN via NAND gate 126 and inverter 128. LOSCEN, and the inverse signal OSCEN, enable calibration oscillator 50 connected to the inputs of discriminators 28 and 30. After a short time delay determined by resistor 168 and capacitor 170, LSAMFB also goes low and closes switch 52 to connect integrator 54 to discriminator 28 to calibrate the gain of that discriminator. Also when DBP goes high it causes LSAMFT to go high via NAND gate 134 to open switch 102 thereby disconnecting the differentiator circuit during retrace. When PL goes low again LSAMFB and LOSCEN immediately go low and LSAMFT is delayed by a resistor 136 and a capacitor 138 so that it does not go high again until the new sweep is underway. Wave forms illustrating this operation are shown in FIG. 8.

Figure 7:
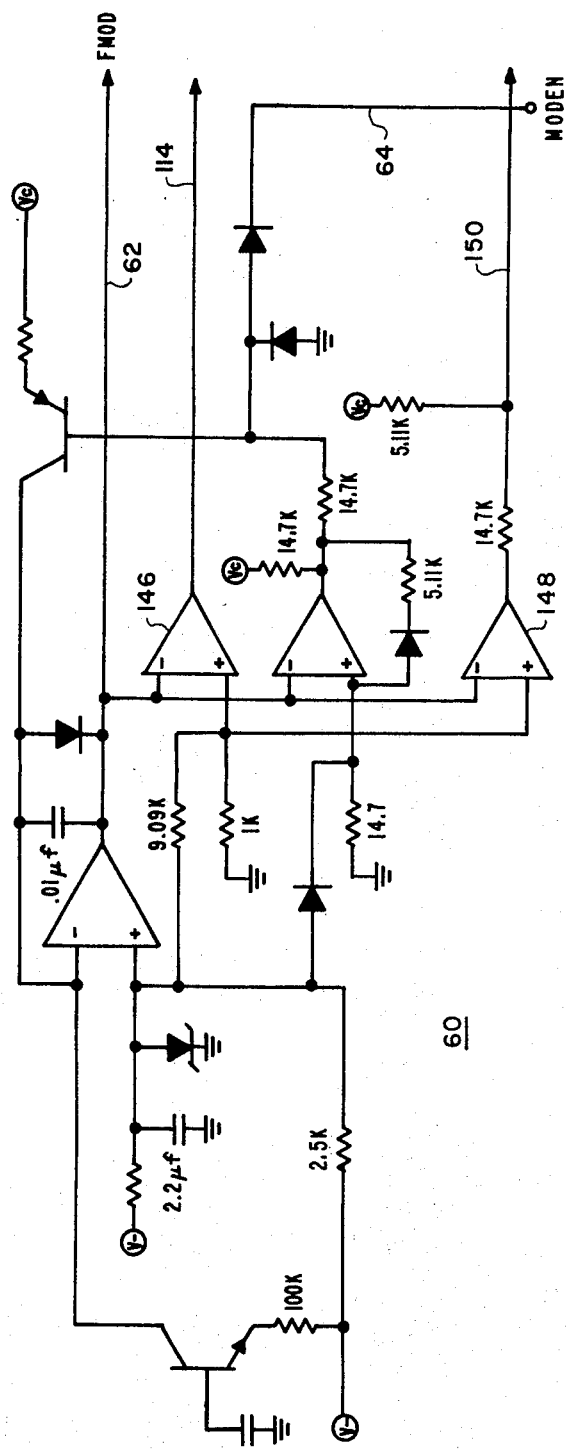
FIG. 7 shows a schematic diagram of a sawtooth generator.
Figure 9:
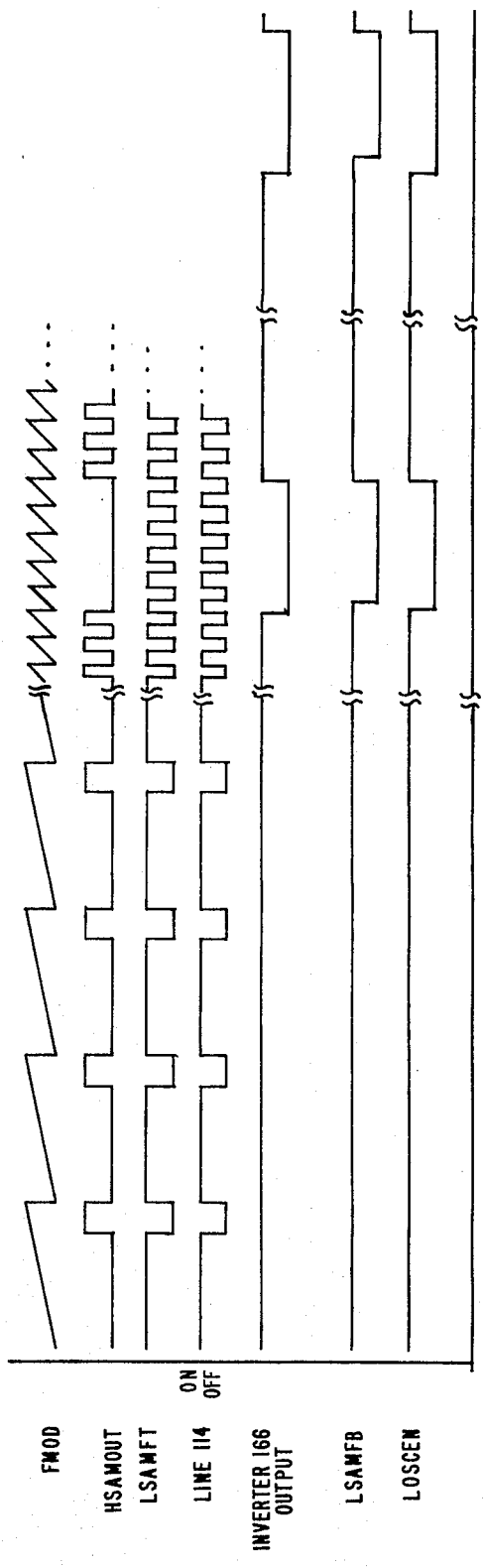

When the slope signal goes below the threshold set at the input of comparator 58, HMOD goes high to turn-on sawtooth generator 60 shown schematically in FIG. 7, and to cause the output of that generator to be added to the swept frequency generator tuning voltage. An enable signal for the sawtooth generator, MODEN, is produced on line 64 by an inverter 142 and a NAND gate 144. NAND gate 144 receives the HMOD signal and a GDEN signal which is high whenever a front panel control selects the group delay measurement mode. When MODEN is high, a sawtooth signal appears on line 62 and is shown as FMOD in FIG. 9. Comparators 146 and 148 connected to line 62 produce output pulses when the sawtooth signal reaches its highest level. Comparator 146 connected to line 114 turns off FET switch 108 at the very end of each sawtooth; when no sawtooth is being generated comparator 146 maintains FET switch 108 in the "on" condition continuously. Comparator 148 produces essentially the same output signal as comparator 146 and the output from comparator 148 on line 150 is connected to a NAND gate 152 in order to operate switch 104 and 102 in synchronism with the sawtooth wave form. At the very end of each sawtooth LSAMFT and LSAM-OUT go low to cause an instantaneous sample and hold, storing the value of the group delay measurement on capacitor 106. After switch 104 opens again when LSAMOUT goes high switch 108 will close again applying the value on capacitor 106 to the output and thus to the display.

As mentioned above, during the retrace the calibration oscillator 50 is energized and switch 52 is closed to calibrate the gain of discriminator 28. Since very slow sweeps may continue for several seconds or even minutes, it is desirable to calibrate the discriminator several times during a slower sweep. Applicant has found it advantageous to calibrate approximately once per second and thus an oscillator 133 with a one-second period is also provided in control logic 48 as shown in FIG. 6. Oscillator 133 is formed by NAND gate 126, inverter 128 and associated components. If more than one second has passed since a retrace oscillator 133 will produce a LOSCEN pulse with a duration of approximately 10 milliseconds every second. This operation is illustrated in the righthand portion of FIG. 9 which has an expanded time scale compared with the lefthand portion of FIG. 9. This same pulse also passes through a resistor 168 and a capacitor 170 to make LSAMOUT high so that the calibrate signal does not appear on the group delay output.

I claim:
1. A method of measuring the group delay of a device under test comprising the steps of:
generating an a.c. signal that is varied from a first to a second frequency;
generating a control signal that varies in accordance with the frequency of the a.c. signal;
supplying the a.c. signal to a device under test;
receiving an output signal from the device under test;
determining the instantaneous frequency difference between the a.c. signal and the output signal;
determining the instantaneous rate of change of the control signal; and
dividing the instantaneous frequency difference by the instantaneous rate of change of the control signal to produce a signal indicative of the group delay of the device under test.

2. A method as in claim 1 further comprising the step of frequency converting the a.c. signal and the output signal using a common converting signal to produce a reference intermediate frequency signal and a test intermediate frequency signal respectively.

3. A method as in claim 2 wherein the step of determining the instantaneous frequency difference comprises the steps of:
producing a first signal proportional to the frequency of the reference intermediate frequency signal;
producing a second signal proportional to the frequency of the test intermediate frequency signal; and
producing a third signal equal to the difference between the first and second signals.

4. A method as in claim 3 wherein the step of generating an a.c. signal includes varying the frequency of the signal in a sawtooth manner.

5. An apparatus for measuring the group delay of a device under test, the apparatus comprising:
a signal generator for producing an a.c. signal that varies from a first to a second frequency and for producing a control signal that varies in accordance with the frequency of the a.c. signal;
output connector means for supplying the a.c. signal to a device under test;
input connector means for receiving an output signal from a device under test;
frequency measuring means connected to the signal generator and the input connector means for determining the instantaneous frequency difference between the a.c. signal and the output signal and for producing a difference signal indicative of the instantaneous frequency difference;
differentiator means connected to the signal generator for determining the instantaneous rate of change of the control signal and for producing a slope signal indicative of the instantaneous rate of change of the control signal; and
divider means connected to the frequency measuring means and to the differentiator means for dividing the difference signal by the slope signal to produce a measurement signal indicative of the group delay of a device under test.

6. An apparatus as in claim 5 wherein the frequency measuring means includes:
a signal source for supplying an a.c. conversion signal;
first converter means connected to the signal generator and the signal source for converting the a.c.

signal to an intermediate frequency reference signal;

second converter means connected to the input connector means and the signal source for converting the output signal to an intermediate frequency test signal; and frequency difference measuring means connected to the first and second converter means for determining the instantaneous frequency difference between the intermediate frequency reference signal and the intermediate frequency test signal for producing the difference signal.

7. An apparatus as in claim 6 wherein the frequency difference measuring means comprises:

first circuit means connected to the first converter means for producing a first signal proportional to the frequency of the intermediate frequency reference signal;

second circuit means connected to the second converter means for producing a second signal proportional to the frequency of the intermediate frequency test signal; and third circuit means connected to the first and second circuit means for taking the difference between the first signal and the second signal to produce the difference signal.

8. An apparatus as in claim 7 wherein:

the first circuit means comprises a first discriminator which produces a d.c. signal having a value proportional to the frequency of the intermediate frequency reference signal;

the second circuit means comprises a second discriminator which produces a d.c. signal having a value proportional to the frequency of the intermediate frequency test signal;

the third circuit means comprises a summing circuit which produces a d.c. signal at an output thereof having a value proportional to the difference between the values of the d.c. signals from the first and second discriminators;

the differentiator means comprises a differentiator circuit which produces a d.c. signal having a value proportional to the instantaneous rate of change of the control signal; and the divider means comprises an analog divider which produces a d.c. signal having a value proportional to the quotient of the value of the d.c. signal from the summing circuit and the value of the d.c. signal from the differentiator circuit.

9. An apparatus as in claim 7 further comprising a sawtooth generator connected to the signal generator to cause a sawtooth frequency modulation of the a.c. signal and a corresponding sawtooth variation in the control signal.

10. An apparatus as in claim 9 further comprising:

a synchronous low-pass filter connected between the differentiator means and the divider means responsive to the sawtooth generator to pass the slope signal at a predetermined point in each sawtooth; and a sample and hold circuit connected to the output of the divider means to sample the measurement signal at the predetermined point in each sawtooth.

11. An apparatus as in claim 8 further comprising:

a calibration control circuit for periodically generating a calibrate command signal;

a calibration signal source connected to the first and second discriminators and the calibration control circuit for supplying an a.c. calibration signal to each discriminator in response to the calibrate command signal; and an integrator circuit having an input which is connected to the output of the summing circuit in response to the calibrate command signal and an output connected to one of the first and second discriminators for varying the gain of said discriminator in response to the value of the d.c. signal from the summing circuit produced by the a.c. calibration signal.

* * * * *

UNITED STATES PATENT AND TRADEMARK OFFICE
CERTIFICATE OF CORRECTION

PATENT NO. : 3,968,427
DATED : July 6, 1976
INVENTOR(S) : David D. Sharrit

It is certified that error appears in the above-identified patent and that said Letters Patent are hereby corrected as shown below:

Column 3, line 38, insert an additional right parenthesis -- ) -- at the end of the equation.

Column 3, line 48, cancel "$V_{IF}$" and substitute -- $V_{IF_T}$ --.

Column 5, line 45, delete "$V_{IF}$ and $V_{IF}$" and substitute -- $V_{IF_T}$ and $V_{IF_R}$ --.

$\mathfrak{Signed}$ and $\mathfrak{Sealed}$ this

Fourteenth $\mathfrak{Day}$ of September 1976

[SEAL]

*Attest:*

RUTH C. MASON
*Attesting Officer*

C. MARSHALL DANN
*Commissioner of Patents and Trademarks*